United States Patent
Jung et al.

(10) Patent No.: US 7,376,029 B2
(45) Date of Patent: May 20, 2008

(54) SEMICONDUCTOR MEMORY DEVICES INCLUDING PRECHARGE CIRCUIT AND METHODS FOR PRECHARGING

(75) Inventors: Hyun-Taek Jung, Seoul (KR); Gyu-Hong Kim, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 11/431,536

(22) Filed: May 11, 2006

(65) Prior Publication Data
US 2007/0002653 A1 Jan. 4, 2007

(30) Foreign Application Priority Data
Jun. 30, 2005 (KR) .................. 10-2005-0057757

(51) Int. Cl.
*G11C 7/00* (2006.01)
(52) U.S. Cl. ...................... 365/203; 365/189.05
(58) Field of Classification Search ............... 365/203, 365/189.05
See application file for complete search history.

(56) References Cited
U.S. PATENT DOCUMENTS
5,790,466 A * 8/1998 Hotta .................. 365/203
5,798,975 A * 8/1998 Buttner et al. .............. 365/203
5,825,710 A * 10/1998 Jeng et al. ............. 365/230.03
7,130,232 B2 * 10/2006 Kim et al. ................. 365/203
2007/0070745 A1 * 3/2007 Versen et al. ............... 365/203

FOREIGN PATENT DOCUMENTS
JP 2003-151276 5/2003
KR 10-339423 5/2002
KR 10-2004-0076729 9/2004

* cited by examiner

*Primary Examiner*—Michael T Tran
(74) *Attorney, Agent, or Firm*—Harness, Dickey & Pierce, P.L.C.

(57) ABSTRACT

A precharge circuit of a semiconductor memory device may include a precharge controller, a first precharge unit and a second precharge unit. The precharge controller may enable a first control signal in a precharge mode for a first operation, and may enable a second control signal in a precharge mode for a second operation. The first precharge unit may precharge a pair of I/O lines to a first voltage in response to the first control signal in the precharge mode for the first operation. The second precharge unit may precharge the pair of I/O lines to a second voltage lower than the first voltage in response to the second control signal in the precharge mode for the second operation.

20 Claims, 11 Drawing Sheets

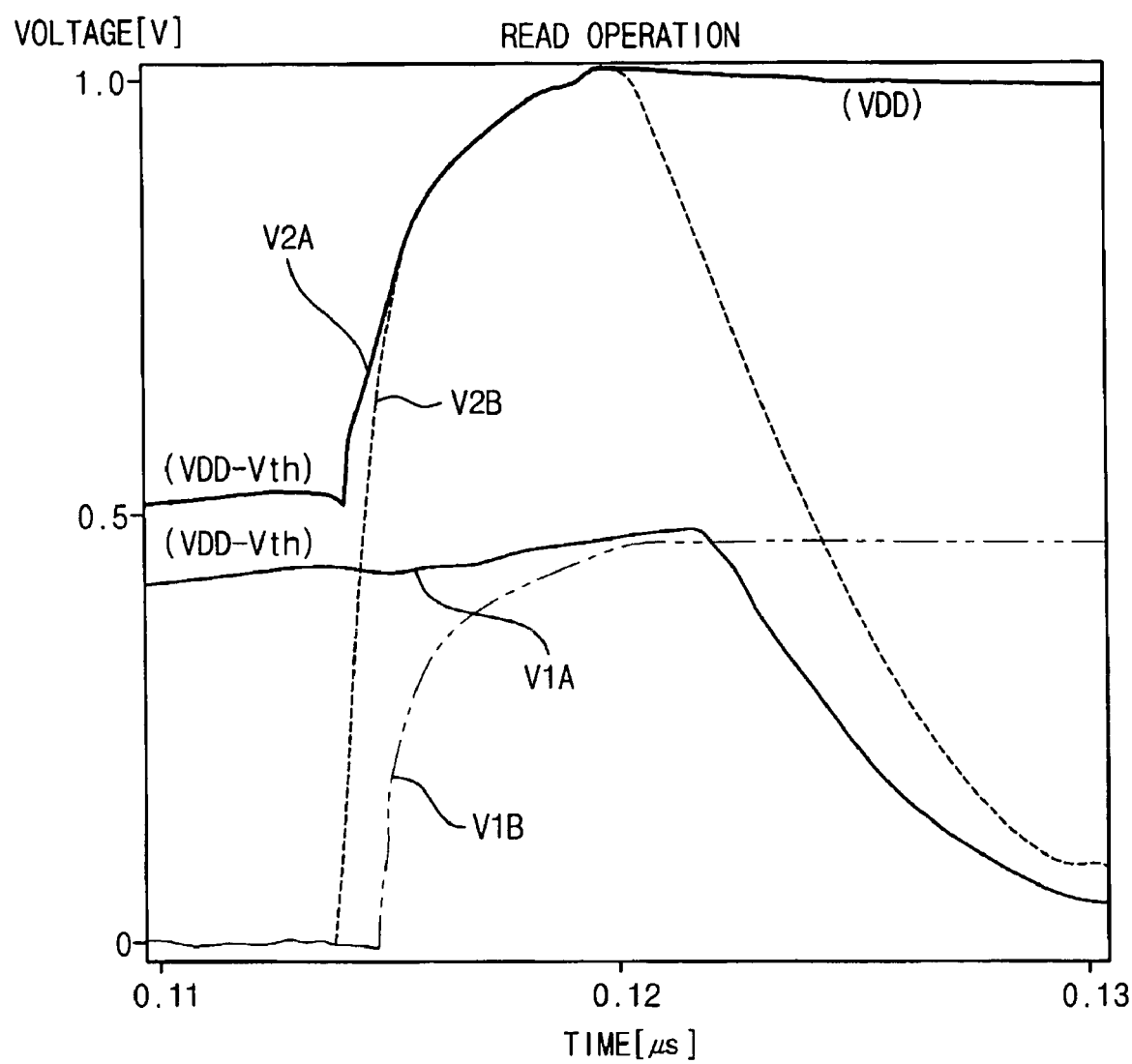

SEMICONDUCTOR MEMORY DEVICES INCLUDING PRECHARGE CIRCUIT AND METHODS FOR PRECHARGING

PRIORITY STATEMENT

This non-provisional U.S. patent application claims priority under 35 U.S.C. § 119 to Korean Patent Application No. 10-2005-0057757 filed on Jun. 30, 2005 in the Korean Intellectual Property Office (KIPO), the entire contents of which are incorporated herein by reference.

BACKGROUND OF THE INVENTION

1. Field of the Invention

Example embodiments of the present invention relate to semiconductor memory devices, for example, a semiconductor memory device including an input/output (I/O) line precharge circuit and method of precharging an I/O line.

2. Description of the Conventional Art

A conventional I/O line must be precharged in order to write and/or read data to/from a memory cell array of a conventional semiconductor memory device. As semiconductor memory devices become more integrated, the number of the I/O lines may be increased. When the number of the I/O lines is increased, power consumption and/or electrical noise may increase.

FIG. 1 is a circuit diagram illustrating a conventional semiconductor memory device including an I/O line driver 10 and a precharge circuit 20. Referring to FIG. 1, the I/O line driver 10 includes drivers DRV1 and DRV2 for driving I/O lines IO<0> and IOB<0>. The drivers DRV1 and DRV2 may include a pull-up transistor and a pull-down transistor, respectively. Each of the pull-up and pull-down transistors may be implemented using NMOS transistors. The precharge circuit 20 may include PMOS transistors M5, M6 and M7, and may be coupled to the I/O lines IO<0> and IOB<0>. When the precharge circuit 20 is activated, the I/O lines IO<0> and IOB<0> may precharge to a higher voltage VDD.

The conventional semiconductor memory device implemented using a semiconductor integrated circuit (IC) may include a plurality of pairs of I/O lines, a plurality of the I/O line drivers 10 and a plurality of the precharge circuits 20. To write data to the semiconductor memory device, an active command signal and a write command signal may be activated. After the write command signal is activated, an I/O line precharge signal PIOPRB_A may be deactivated and a write pulse signal PDT_A may be activated.

Before the write command signal is activated, the PMOS transistors M5, M6 and M7 of the precharge circuit 20 may turn on, and the I/O lines IO<0> and IOB<0> precharge to the voltage VDD. Because the write pulse signal PDT_A is at a logic 'low' level (e.g., a logic '0'), the NMOS transistors M1 and M2 of the driver DRV1 and the NMOS transistors M3 and M4 of the driver DRV2 turn off. As the write command signal is activated, the PMOS transistors M5, M6 and M7 of the precharge circuit 20 may turn off and the NMOS transistors M1 and M2 of the driver DRV1 and the NMOS transistors M3 and M4 of the driver DRV2 may selectively turn off based on input data DIO<0>. For example, when the input data DIO<0> has a 'high' logic level (e.g., a logic '1'), the NMOS transistors M1 and M4 may turn off, and the NMOS transistor M2 and M3 may turn on. After all of the input data are written to a selected memory bank, the write command signal may deactivate and the I/O line precharge signal PIOPRB_A may be activated. As a result, the I/O lines IO<0> and IOB<0> may precharge to the voltage VDD. During the write operation, a data mask signal PDMB may activate and transition to a logic 'low' level. When the data mask signal PDMB activates, the I/O lines corresponding to each of the memory banks precharge to the voltage VDD, and all of the NMOS transistors M1, M2, M3 and M4 turn off.

Because the precharge circuit 20 of the semiconductor memory device shown in FIG. 1 comprises PMOS transistors M5, M6 and M7, the I/O lines I/O<0> and IOB<0> precharge to the voltage VDD. When the I/O lines I/O<0> and IOB<0> precharge to the voltage VDD, a data write operation may cause unnecessary power consumption and/or an unnecessarily long period required to perform data transition.

Alternatively, the conventional precharge circuit 20 of the semiconductor memory device may comprise NMOS transistors. When the precharge circuit 20 is implemented using the NMOS transistors, the I/O lines IO<0> and IOB<0> precharge to (VDD-Vth) due to a threshold voltage Vth of the NMOS transistor. When the I/O lines I/O<0> and IOB<0> precharge to the lower voltage (VDD-Vth), a voltage level of the I/O lines may swing between (VDD-Vth) and ground or between ground and (VDD-Vth). In this example, the power consumption of the semiconductor memory device may be reduced and/or an operating speed of the semiconductor memory device may improve. However, when the I/O lines I/O<0> and IOB<0> precharge to (VDD-Vth), an I/O sense amplifier may not operate with sufficient stability during the read operation. In addition, or alternatively, the precharge operation of the I/O lines I/O<0> and IOB<0> may not be performed with sufficient stability because of the lower precharge level.

SUMMARY OF THE INVENTION

At least some example embodiments of the present invention provide a precharge circuit of a semiconductor memory device capable of more stably precharging the I/O lines, reducing power consumption and/or reducing write time (e.g., a time period for the write operation). Example embodiments of the present invention provide an I/O line precharge circuit capable of stably precharging I/O lines and method for performing the same. Example embodiments of the present invention also provide a semiconductor memory device including an I/O line precharge circuit capable of more stably precharging I/O lines.

In at least one example embodiment of the present invention, a precharge circuit may include a precharge controller, a first precharge unit and/or a second precharge unit. The precharge controller may be configured to enable a first control signal in a precharge mode for a first operation, and enable a second control signal in a precharge mode for a second operation. The first precharge unit may be configured to precharge a pair of I/O lines to a first voltage in response to the first control signal, in the precharge mode for the first operation. The second precharge unit may be configured to precharge the pair of I/O lines to a second voltage lower than the first voltage in response to the second control signal, in the precharge mode for the second operation. The first operation may be a read operation and the second operation may be a read operation or a write operation.

In at least some example embodiments of the present invention, the first precharge unit may be coupled between the pair of I/O lines and may include PMOS transistors serially coupled to each other. The second precharge unit may be coupled between the pair of I/O lines and may include NMOS transistors serially coupled to each other.

The precharge circuit may further include an equalizer configured to equalize the pair of I/O lines in response to a third control signal.

In at least some example embodiments of the present invention, a precharge circuit for precharging an input and output (I/O) line of a semiconductor memory device may include a precharge controller, a first precharge unit and/or a second precharge unit. The precharge controller may be configured to enable a first control signal in a precharge mode for a read operation, enable a second control signal in a precharge mode for a write operation and enable the precharge mode for the read operation. The first precharge unit may be configured to precharge a pair of I/O lines to a first voltage in response to the first control signal, in the precharge mode for the read operation. The second precharge unit may be configured to precharge the pair of I/O lines to a second voltage lower than the first voltage in response to the second control signal, in the precharge mode for the write operation and the precharge mode for the read operation.

In at least some example embodiments of the present invention, a semiconductor memory device may include a plurality of pairs of I/O lines, an I/O line driver, a first precharge unit, a second precharge unit and/or a precharge controller. The I/O line driver may be configured to drive the pair of I/O lines in response to a write command signal and input data. The precharge controller may be configured to enable a first control signal in a precharge mode for a read operation, and enable a second control signal in a precharge mode for a write operation. The first precharge unit may be configured to precharge the pair of I/O lines to a first voltage in response to the first control signal, in the precharge mode for the read operation. The second precharge unit may be configured to precharge the pair of I/O lines to a second voltage in response to the second control signal, in the precharge mode for the write operation.

In another example embodiment of the present invention, a semiconductor memory device may include a plurality of pairs of I/O lines, an I/O line driver, a precharge controller, a first precharge unit and/or a second precharge unit.

In at least some example embodiments of the present invention, the I/O line driver may be configured to drive the pair of I/O lines in response to a write command signal and input data. The precharge controller may be configured to enable a first control signal in a precharge mode for a read operation, and enable a second control signal in a precharge mode for a write operation and the precharge mode for the read operation. The first precharge unit may be configured to precharge the pair of I/O lines to a first voltage in response to the first control signal, in the precharge mode for the read operation. The second precharge unit may be configured to precharge the pair of I/O lines to a second voltage lower than the first voltage in response to the second control signal, in the precharge mode for the read operation and the precharge mode for the write operation.

In another example embodiment of the present invention, a first control signal and a second control signal may be generated in response to a write signal and a precharge signal. A pair of I/O lines may be precharged to a first voltage in response to the first control signal, in a precharge mode for a first operation, and the pair of I/O lines may be precharged to a second voltage lower than the first voltage in response to the second control signal, in a precharge mode for a second operation. The first operation may be a read operation, and the second operation may be a write operation.

In another example embodiment of the present invention, a first control signal and a second control signal may be generated in response to a write signal and a precharge signal. A pair of I/O lines may be precharged to a first voltage in response to the first control signal, in a precharge mode for a first operation. The pair of I/O lines may be precharged to a second voltage lower than the first voltage in response to the second control signal, in a precharge mode for a second operation. The first operation may be a read operation, and the second operation may be a read operation or a write operation.

BRIEF DESCRIPTION OF THE DRAWINGS

The present invention will become more apparent when described in detailed example embodiments thereof with reference to the attached drawings in which:

FIG. 9 is a graph showing simulation results of voltage waveforms of I/O lines GIO and GIOB in a precharge mode for a read operation, according to an example embodiment of the present invention compared to the conventional art;

Figure 1:
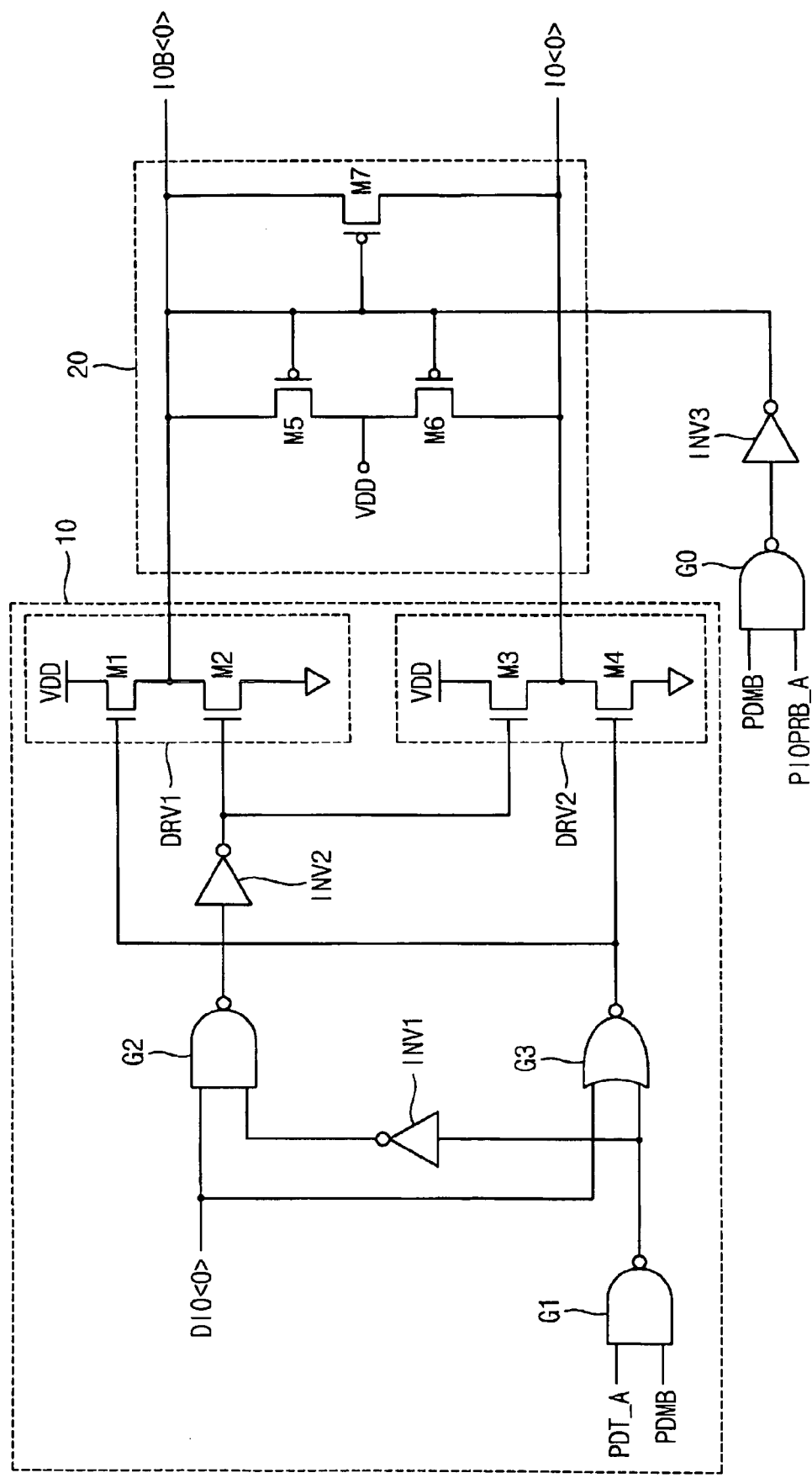
FIG. 1 is a circuit diagram illustrating a conventional semiconductor memory device including an I/O line driver and a precharge circuit.

DETAILED DESCRIPTION OF EXAMPLE
EMBODIMENTS OF THE PRESENT
INVENTION

Detailed, illustrative, example embodiments of the present invention are disclosed herein. However, specific structural and functional details disclosed herein are merely representative for purposes of describing example embodiments of the present invention. This invention may, however, be embodied in many alternate forms and should not be construed as limited to the embodiments set forth herein.

Accordingly, while the present invention is susceptible to various modifications and alternative forms, example embodiments thereof are shown by way of example in the drawings and will herein be described in detail. It should be understood, however, that there is no intent to limit the present invention to the particular example embodiments disclosed, but on the contrary, the present invention is to cover all modifications, equivalents, and alternatives falling within the spirit and scope of the present invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular example embodiments only and is not intended to be limiting of the present invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
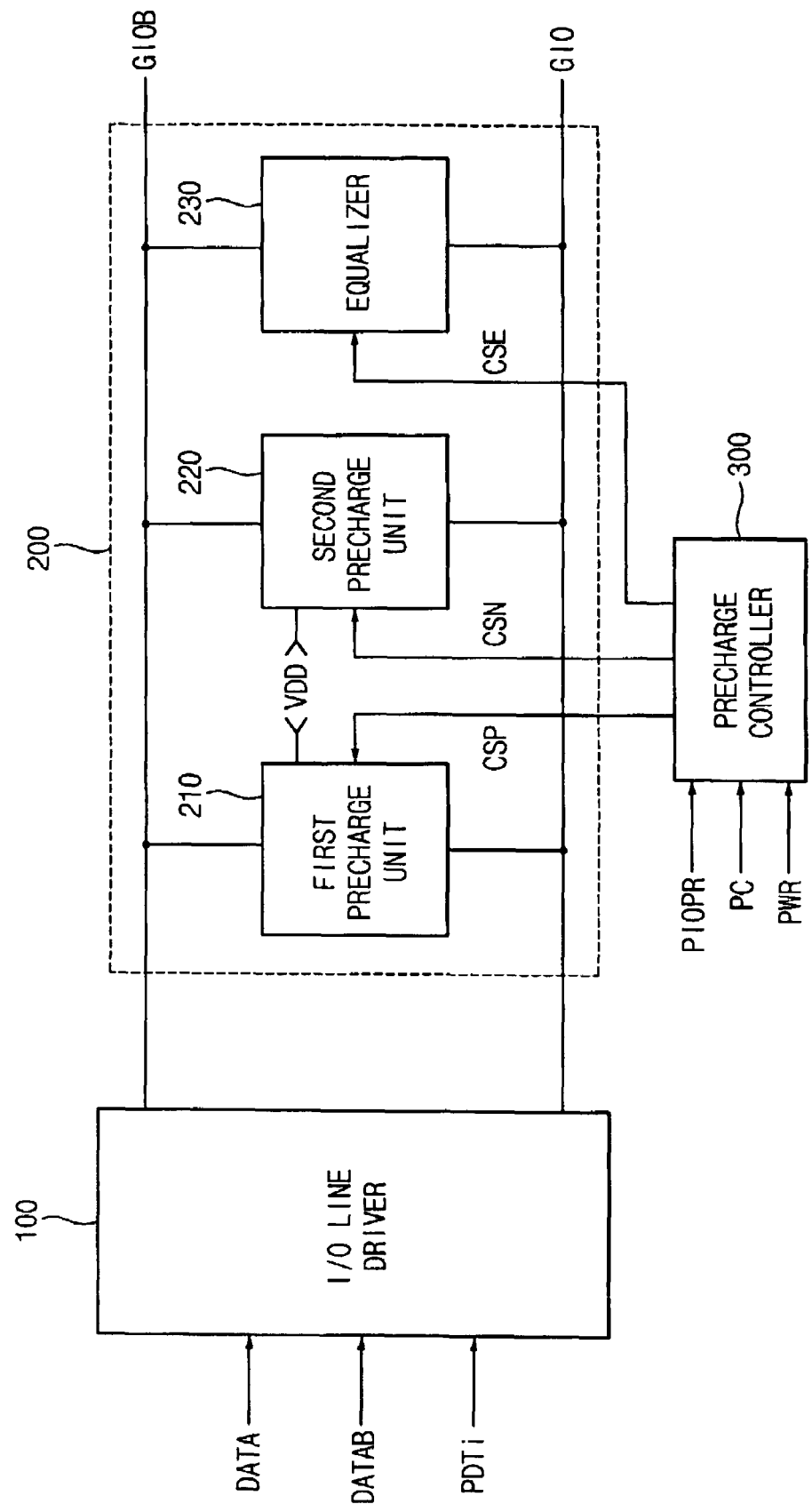
FIG. 2 is a block diagram illustrating a semiconductor memory device according to an example embodiment of the present invention.

FIG. 2 is a block diagram illustrating a semiconductor memory device according to an example embodiment of the present invention. As shown, a semiconductor memory device may include an I/O line driver 100, a precharge circuit 200 and/or a precharge controller 300.

The semiconductor memory device implemented using, for example, a semiconductor integrated circuit (IC) may include a plurality of the I/O lines GIO and GIOB, a plurality of the I/O line drivers 100 and a plurality of the precharge circuits 200. An I/O sense amplifier (not shown) may be coupled between the I/O lines GIO and GIOB, and the I/O sense amplifier (not shown) functions to amplify output data during the read operation.

The I/O line driver 100 may drive the input lines GIO and GIOB in response to a write pulse signal PDTi and input data DATA and DATAB. The write pulse signal PDTi may be activated in response to the write command signal.

The precharge circuit 200 may include a first precharge unit 210 and/or a second precharge unit 220. The first precharge unit 210 may precharge the I/O lines GIO and GIOB to a first voltage (e.g., a voltage VDD) in response to a first control signal CSP during a precharge mode for a read operation. The second precharge unit 220 may precharge the I/O lines GIO and GIOB to a second voltage (e.g., VDD-Vth) lower than the first voltage in response to a second control signal CSN during a precharge mode for a write operation. The 'Vth' represents a threshold voltage of a transistor (e.g., a NMOS transistor). Alternatively, the second precharge unit 220 may precharge the I/O lines GIO and GIOB to the second voltage (e.g., VDD-Vth) in response to the second control signal CSN during the precharge mode for the write operation and the precharge mode for the read operation.

The precharge circuit 200 may further include an equalizer 230 that equalizes the I/O lines GIO and GIOB in response to a third control signal CSE.

The precharge controller 300 may generate the first control signal CSP and the second control signal CSN in response to an active command signal PC, a write signal PWR and a precharge signal PIOPR. The precharge controller 300 may provide the first control signal CSP to the first precharge unit 210 and the second control signal CSN to the second precharge unit 220. The precharge controller 300 may generate the third control signal CSE, and provide the third control signal CSE to the equalizer 230.

Figure 3:
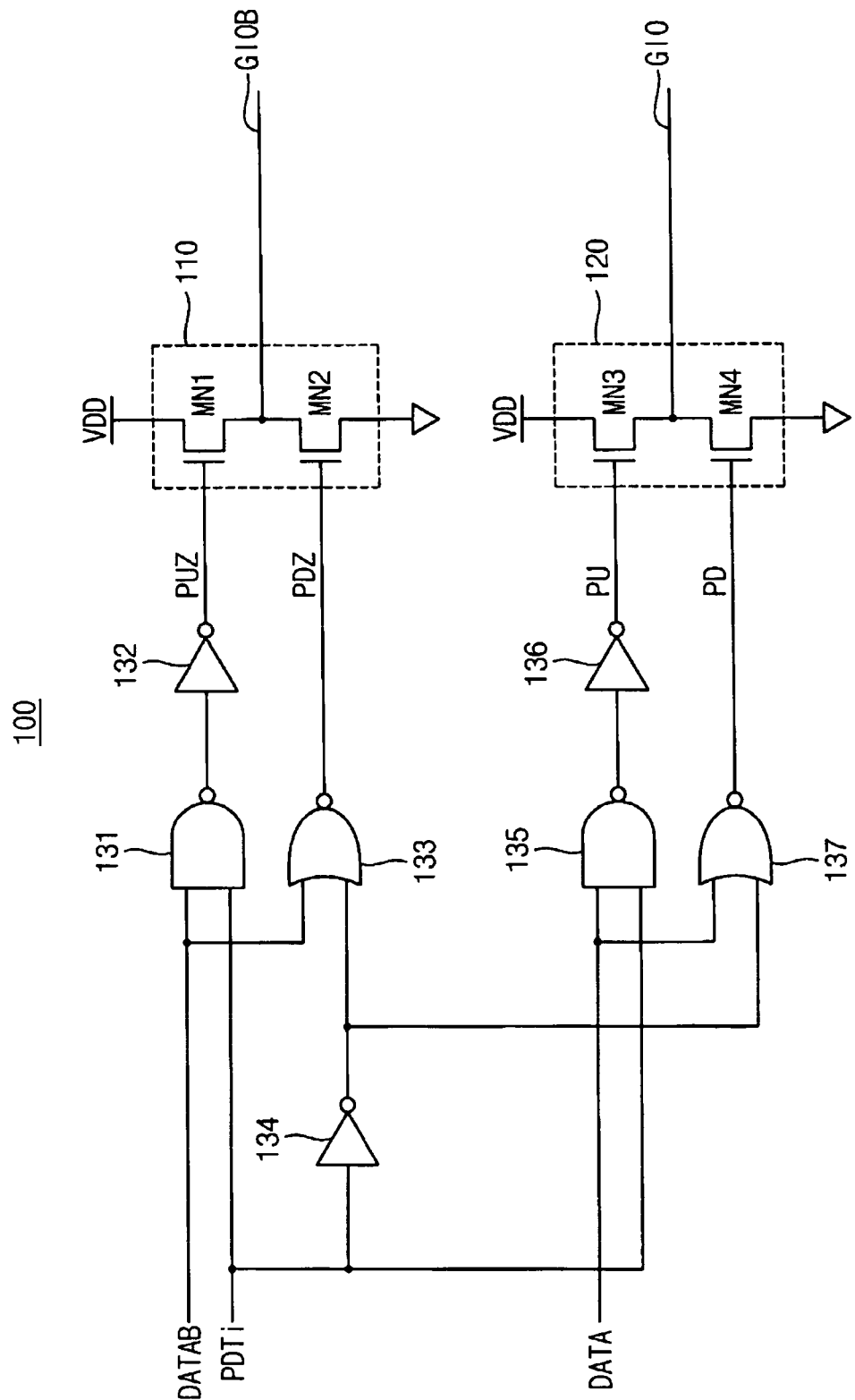
FIG. 3 is a circuit diagram illustrating an I/O line driver according to an example embodiment of the present invention.

FIG. 3 is a circuit diagram illustrating an example of the I/O line driver 100 included in the semiconductor memory device shown in FIG. 2. As shown, the I/O line driver 100 may include a first driver 110 composed of, for example, NMOS transistors MN1 and MN2, and a second driver 120 composed of, for example, NMOS transistors MN3 and MN4. The I/O line driver 100 may further include, for example, NAND gates 131 and 135, NOR gates 133 and 137, and inverters 132, 134 and 136.

The inverter 134 may invert the write pulse signal PDTi. The NAND gate 131 may perform a logical NAND operation on the inverted input data DATAB and the write pulse signal PDTi. The NAND gate 135 may perform a logical NAND operation on the input data DATA and the write pulse signal PDTi. The NOR gate 133 may perform a logical NOR operation on the inverted input data DATAB and an output signal of the inverter 134 to generate a first pull-down signal PDZ. The NOR gate 137 may perform a logical NOR operation on the input data DATA and the output signal of the inverter 134 to generate a second pull-down signal PD. The inverter 132 may invert an output signal of the NAND gate 131 to generate a first pull-up signal PUZ. The inverter 136 may invert an output signal of the NAND gate 135 to generate a second pull-up signal PU. The first pull-up signal PUZ may drive the pull-up transistor MN1 constituting the first driver 110, and the second pull-up signal PU may drive the pull-up transistor MN3 constituting the second driver 120. The first pull-down signal PDZ may drive the pull-down transistor MN2 constituting the first driver 110, and the second pull-down signal PD may drive the pull-down transistor MN4 constituting the second driver 120. An output signal of the first driver 110 may be provided to the I/O line GIOB, and an output signal of the second driver 120 may be provided to the I/O line GIO.

When the write pulse signal PDTi representing the start of the write operation is enabled, the I/O line driver 100 shown in FIG. 3 may transfer the input data DATA to the I/O line GIO and may transfer the inverted input data DATAB to the I/O line GIOB.

Figure 4:
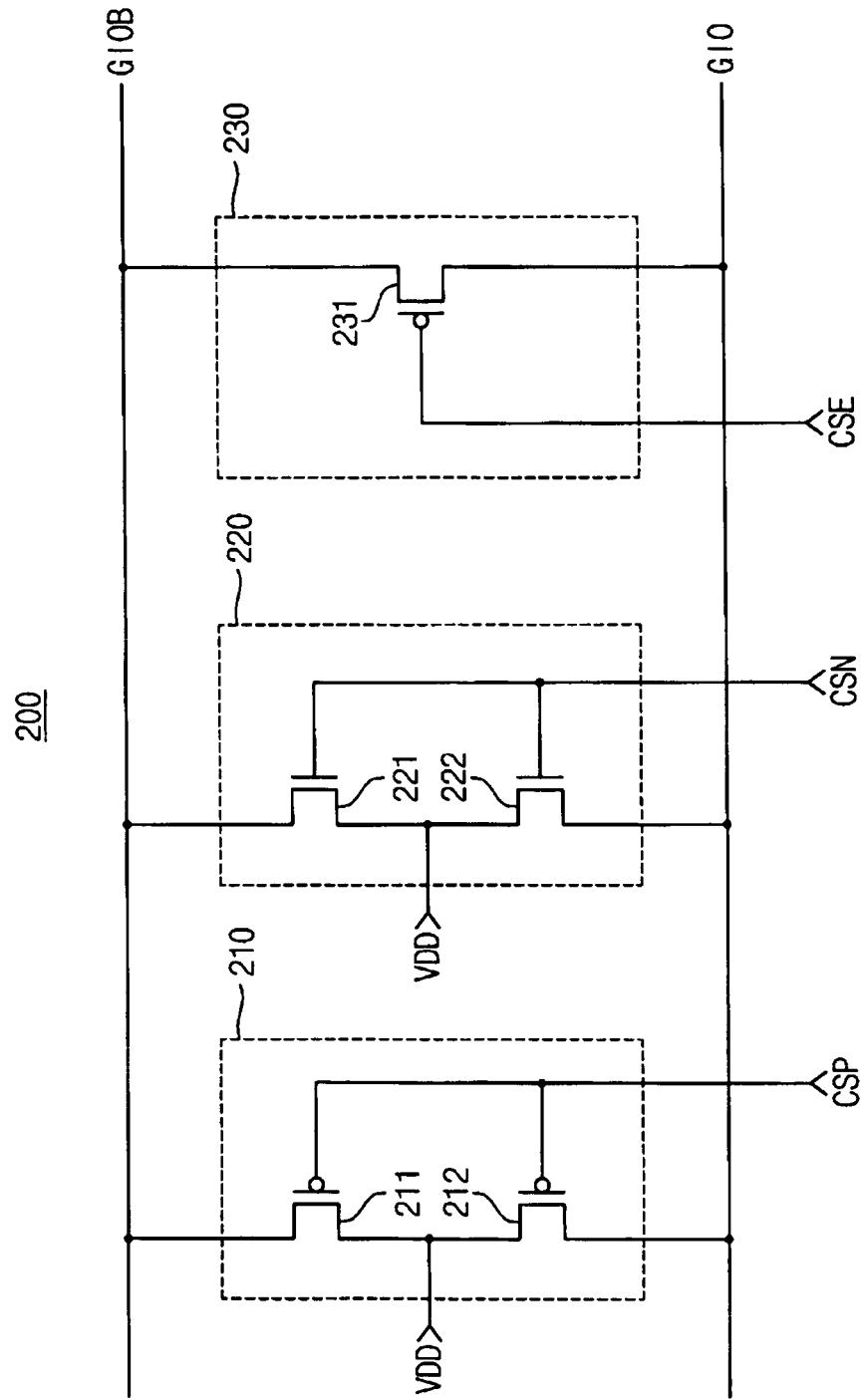
FIG. 4 is a circuit diagram illustrating a precharge circuit according to an example embodiment of the present invention.

FIG. 4 is a circuit diagram illustrating an example of the precharge circuit 200 included in the semiconductor memory device shown in FIG. 2. As shown, the precharge circuit 200 may include a first precharge unit 210 and/or a second precharge unit 220. The first precharge unit 210 may include transistors (e.g., PMOS transistors) 211 and 212, and the second precharge unit 220 may include transistors (e.g., NMOS transistors) 221 and 222. The precharge circuit 200 may further include an equalizer 230 for equalizing the input lines GIO and GIOB. The equalizer 230 may include a transistor (e.g., PMOS transistor) 231.

Hereinafter, operations of the semiconductor memory device shown in FIG. 2 according to an example embodiment of the present invention will be described with reference to FIGS. 2 through 4.

The I/O line driver 100 may drive the input lines GIO and GIOB in response to the write pulse signal PDTi and the input data DATA and DATAB. The write pulse signal PDTi may be activated in response to the write command signal. The I/O line driver 100 may receive the input data DATA and DATAB from an external device under control of the write pulse signal PDTi generated in response to the write command signal, and may provide the input data DATA and DATAB to the I/O lines GIO and GIOB. The input data DATA and DATAB provided to the I/O lines GIO and GIOB may be stored in the memory cell array.

Before the input data DATA and DATAB are provided to the input lines GIO and GIOB, the I/O lines GIO and GIOB may be precharged to a desired (e.g., given) voltage level. 'Precharge' may refer to a process in which particular data are charged in advance to a desired or given voltage level. A precharge mode may include a precharge mode for the data write operation and a precharge mode for the data read operation.

The first precharge unit 210 included in the precharge circuit 200 may include PMOS transistors 211 and 212, and the second precharge unit 220 may include NMOS transistors 221 and 222. Because the first precharge unit 210 is comprised of the PMOS transistors 211 and 212, a first power voltage VDD applied to the first precharge unit 210 may be provided to the I/O lines GIO and GIOB. Because the second precharge unit 220 is comprised of the NMOS transistors 221 and 222, the first power voltage VDD applied to the second precharge unit 220 may be decreased by as much as the threshold voltage Vth of the NMOS transistor. As a result, a voltage level corresponding to the first power voltage VDD minus the threshold voltage (VDD-Vth) may be provided to the I/O lines GIO and GIOB. For example, the first precharge unit 210 may precharge the I/O lines GIO and GIOB to the voltage VDD in response to the first control signal CSP, and the second precharge unit 220 may precharge the I/O lines GIO and GIOB to a voltage level of (VDD-Vth).

Figure 5:
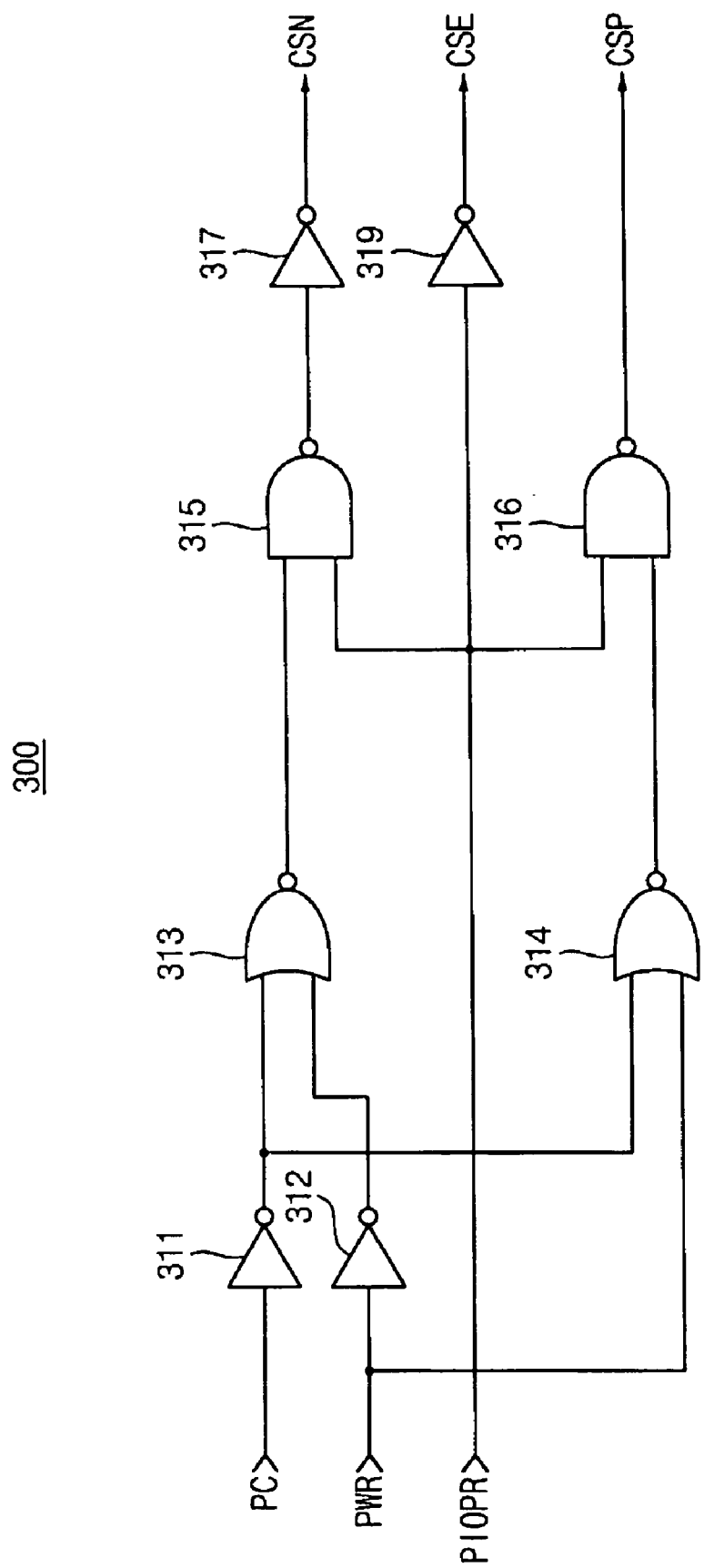
FIG. 5 is a circuit diagram illustrating a precharge controller according to an example embodiment of the present invention.

FIG. 5 is a circuit diagram illustrating an example precharge controller 300 included in the semiconductor memory device shown in FIG. 2. As shown, the precharge controller 300 may include inverters 311, 312, 317, 319, NOR gates 313, 314, and/or NAND gates 315, 316.

The inverter 311 may invert the active command signal PC, and the inverter 312 may invert the write signal PWR. The NOR gate 313 may perform a logical NOR operation on an output signal of the inverter 311 and an output signal of the inverter 312. The NOR gate 314 may perform a logical NOR operation on the output signal of the inverter 311 and the write signal PWR. The NAND gate 315 may perform a logical NAND operation on an output signal of the NOR gate 313 and the precharge signal PIOPR. The NAND gate 316 may perform a logical NAND operation on an output signal of the NOR gate 314 and the precharge signal PIOPR, to generate the first control signal CSP. The inverter 317 may invert an output signal of the NAND gate 315 to generate the second control signal CSN. The inverter 319 may invert the precharge signal PIOPR to generate the third control signal CSE.

Figure 6:
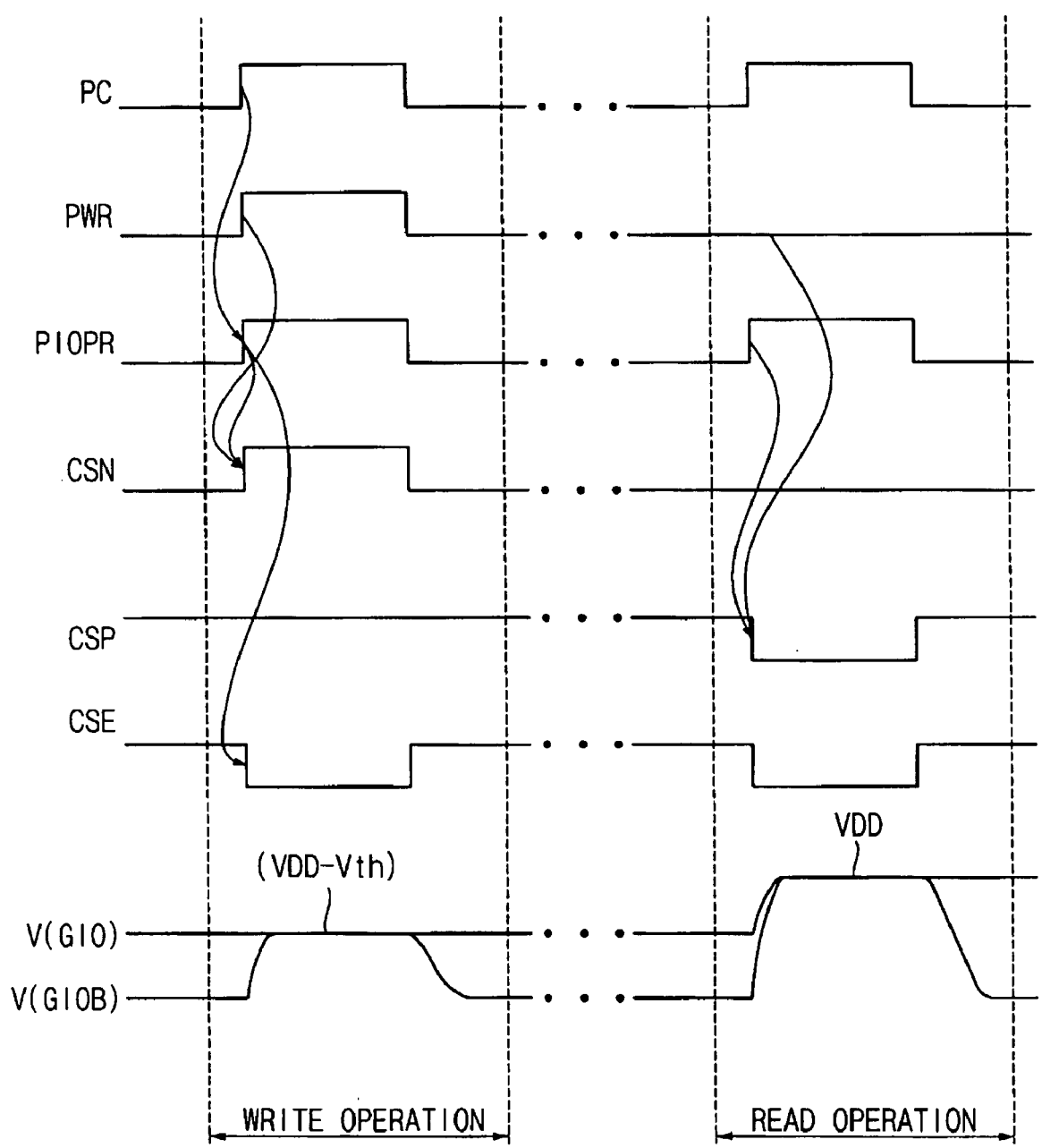
FIG. 6 is a timing diagram illustrating example operation of the semiconductor memory device shown in FIG. 2 in which the precharge controller shown in FIG. 5 is used.

FIG. 6 is a timing diagram illustrating an example operation of the semiconductor memory device shown in FIG. 2 including the precharge controller 300 shown in FIG. 5. Hereinafter, example operation of the precharge controller 300 according to an example embodiment of the present invention will be described with reference to FIGS. 5 and 6.

Referring to FIG. 6, in the precharge mode for the write operation and the precharge mode for the read operation, the precharge signal PIOPR may be generated in response to the active command signal PC. The write signal PWR may be enabled in the precharge mode for the write operation, and may be disabled in the precharge mode for the read operation. The first control signal CSP may be generated in response to the write signal PWR. The precharge signal PIOPR may be enabled in the precharge mode for the read operation and disabled in the precharge mode for the write operation. The second control signal CSN may be generated in response to the write signal PWR. The precharge signal PIOPR may be enabled in the precharge mode for the write operation and disabled in the precharge mode for the read operation. The third control signal CSE may be an inverted signal of the precharge signal PIOPR. The third control signal CSE may have a logic 'low' state in the precharge mode for the write operation and the read operation.

Because the first control signal CSP is enabled in the precharge mode for the read operation, the PMOS transistors 211 and 212 constituting the first precharge unit 210 shown in FIG. 4 may be turned on in the precharge mode for the read operation in response to the first control signal CSP, and may precharge the I/O lines GIO and GIOB to voltage VDD.

Because the second control signal CSN may be enabled in the precharge mode for the write operation, the NMOS transistors 221 and 222 constituting the second precharge unit 220 shown in FIG. 4 may be turned on in the precharge mode for the write operation in response to the second control signal CSN, and may precharge the I/O lines GIO and GIOB to the voltage level of (VDD-Vth). The 'Vth' may be a threshold voltage of an NMOS transistor (e.g., NMOS transistor 221 or 222).

Because the third control signal CSE has the logic 'low' state in the precharge mode for the write operation and the read operation, the PMOS transistor 231 constituting the equalizer 230 shown in FIG. 4 may be turned on in the precharge mode for the write operation and the read operation in response to the third control signal CSE, and may equalize the I/O lines GIO and GIOB.

Figure 7:
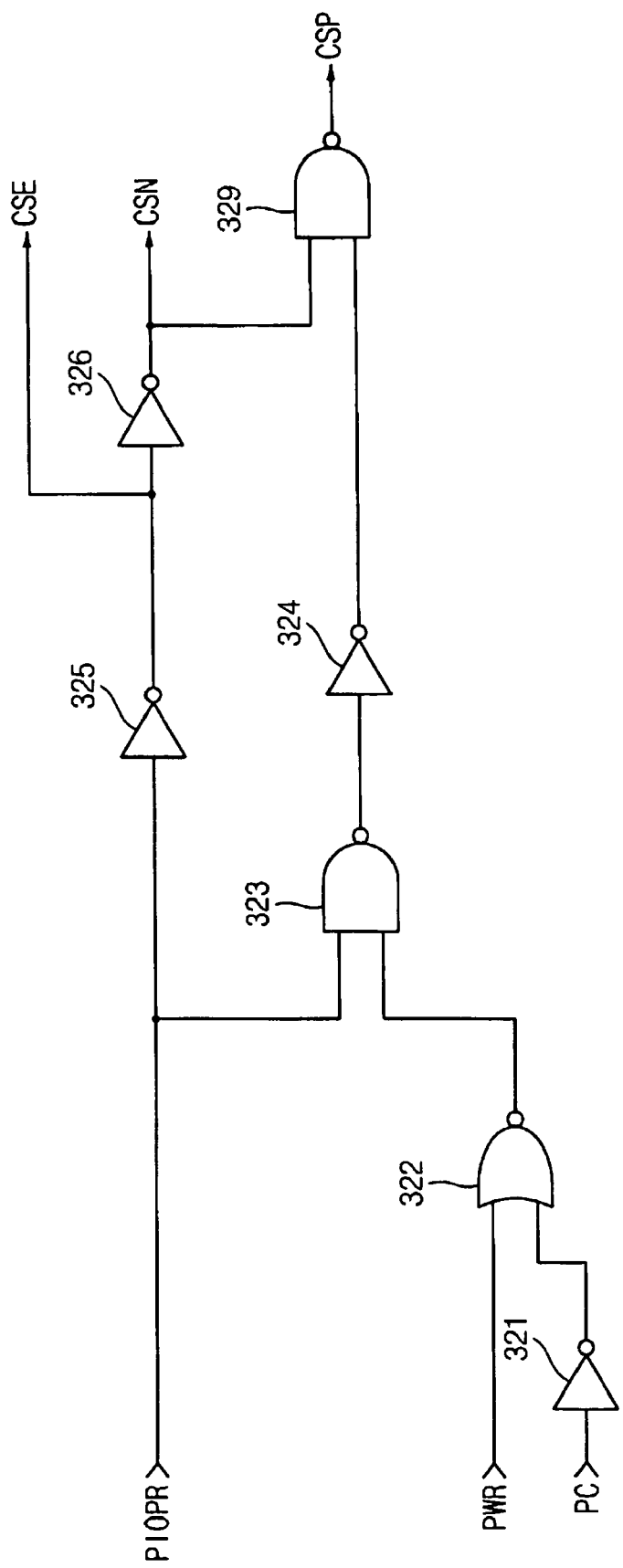
FIG. 7 is a circuit diagram illustrating a precharge controller according to another example embodiment of the present invention.

FIG. 7 is a circuit diagram illustrating another example of the precharge controller 300 included in the semiconductor memory device shown in FIG. 2. As shown, the precharge controller 300 may include inverters 321, 324, 325, 326, a NOR gate 322 and NAND gates 323 and 329.

The inverter 321 may invert the active command signal PC. The inverter 325 may invert the precharge signal PIOPR to generate the third control signal CSE. The NOR gate 322 may perform a logic NOR operation on an output signal of the inverted 321 and the write signal PWR. The NAND gate 323 may perform a logic NAND operation on an output signal of the NOR gate 322 and the precharge signal PIOPR. The inverter 324 may invert an output signal of the NAND gate 323. The inverter 326 may invert an output signal of the inverter 325 to generate the second control signal CSN. The NAND gate 329 may perform a logic NAND operation on the second control signal CSN and an output signal of the inverter 324 to generate the first control signal CSP.

Figure 8:
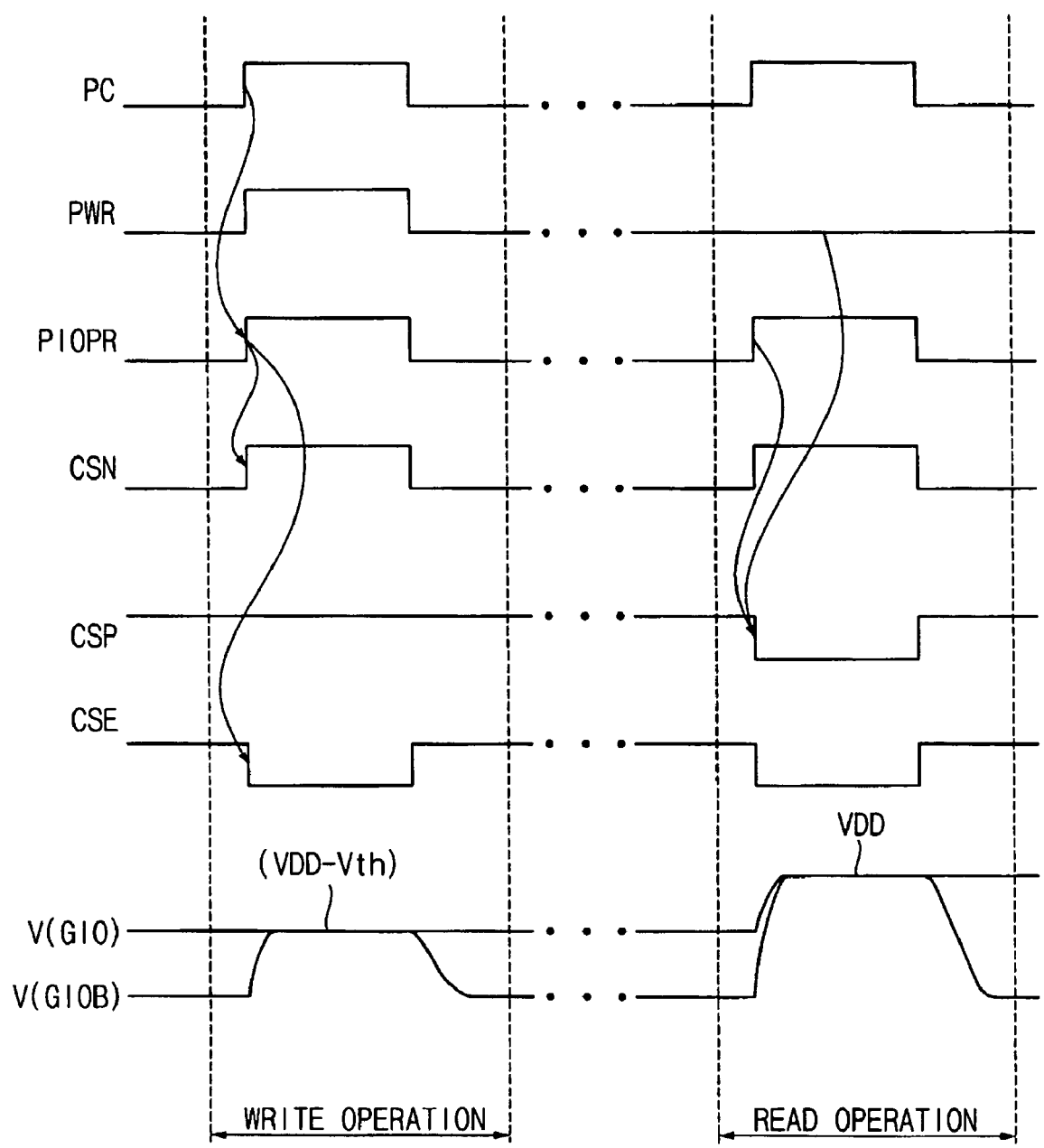
FIG. 8 is a timing diagram illustrating example operation of the semiconductor memory device shown in FIG. 2, in which the precharge controller shown in FIG. 7 is used.

FIG. 8 is a timing diagram illustrating an operation of the semiconductor memory device shown in FIG. 2, in which the precharge controller 300 shown in FIG. 7 is used. Hereinafter, an operation of the precharge controller 300 according to an example embodiment of the present invention will be described with reference to FIGS. 7 and 8.

Referring to FIG. 8, in the precharge mode for the write operation and the read operation, the precharge signal PIOPR may be generated in response to the active command signal PC. The write signal PWR may be enabled in the precharge mode for the write operation, and may be disabled in the precharge mode for the read operation. The first control signal CSP may be generated in response to the write signal PWR and the precharge signal PIOPR and may be enabled in the precharge mode for the read operation and may be disabled in the precharge mode for the write operation. The second control signal CSN may be generated in response to the precharge signal PIOPR, and may be enabled in the precharge mode for the write operation and the precharge mode for the read operation. The third control signal CSE may be an inverted signal of the precharge signal PIOPR, and may have a logic 'low' state in the precharge mode for the write operation and the read operation.

Because the first control signal CSP is enabled in the precharge mode for the read operation, the PMOS transistors 211 and 212 constituting the first precharge unit 210 shown in FIG. 4 may be turned on in the precharge mode for the read operation in response to the first control signal CSP, and may precharge the I/O lines GIO and GIOB to voltage VDD.

Because the second control signal CSN is enabled in the precharge mode for the write operation and the read operation, the NMOS transistor 221 and 222 constituting the second precharge unit 220 shown in FIG. 4 may be turned on in the precharge mode for the write operation and the read operation in response to the second control signal CSN, and may precharge the I/O lines GIO and GIOB to (VDD-Vth).

Because the third control signal CSE has a logic 'low' state in the precharge mode for the write operation and the read operation, the PMOS transistor 231 constituting the equalizer 230 shown in FIG. 4 may be turned on in the precharge mode for the write operation and the read operation in response to the third control signal CSE, and may equalize the I/O lines GIO and GIOB.

FIG. 9 is a simulation graph illustrating voltage waveforms of I/O lines GIO and GIOB in a precharge mode for a read operation, according to an example embodiment of the present invention compared to the conventional art. In FIG. 9, the conventional semiconductor memory device refers to a semiconductor memory device including a precharge circuit composed of only NMOS transistors. The semiconductor memory device according to at least one example embodiment of the present invention refers to a semiconductor memory device including a first precharge unit 210 composed of the PMOS transistors 211 and 212, and the second precharge unit 220 composed of the NMOS transistors 221 and 222 as shown, for example, in FIG. 4.

'V1A' and 'V1B' in FIG. 9 represent the respective voltages V(GIO) and V(GIOB) of the I/O lines of the conventional semiconductor memory device, and 'V2A' and 'V2B' represent the respective voltages V(GIO) and V(GIOB) of the I/O lines of the semiconductor memory device according to example embodiments of the present invention. Referring to FIG. 9, the I/O lines GIO and GIOB in the conventional semiconductor memory device are precharged to a voltage level of (VDD-Vth) in the precharge mode for the read operation. The I/O lines GIO and GIOB in the semiconductor memory device according to example embodiments of the present invention are precharged to a voltage level VDD in the precharge mode for the read operation. As a result, the semiconductor memory device according to example embodiments of the present invention may operate the I/O sense amplifier (not shown) more stably in the precharge mode for the read operation because the PMOS transistors 211 and 212 of the first precharge unit 210 shown in FIG. 4 are turned on to precharge the I/O lines GIO and GIOB to VDD in the precharge mode for the read operation. As illustrated in FIG. 9, the voltage level (VDD-Vth) of the conventional semiconductor memory device is different from that of the semiconductor memory device according to example embodiments of the present invention. The difference may be a result of different operating conditions between the conventional semiconductor memory device and the semiconductor memory device according to example embodiments of the present invention.

Figure 10A:
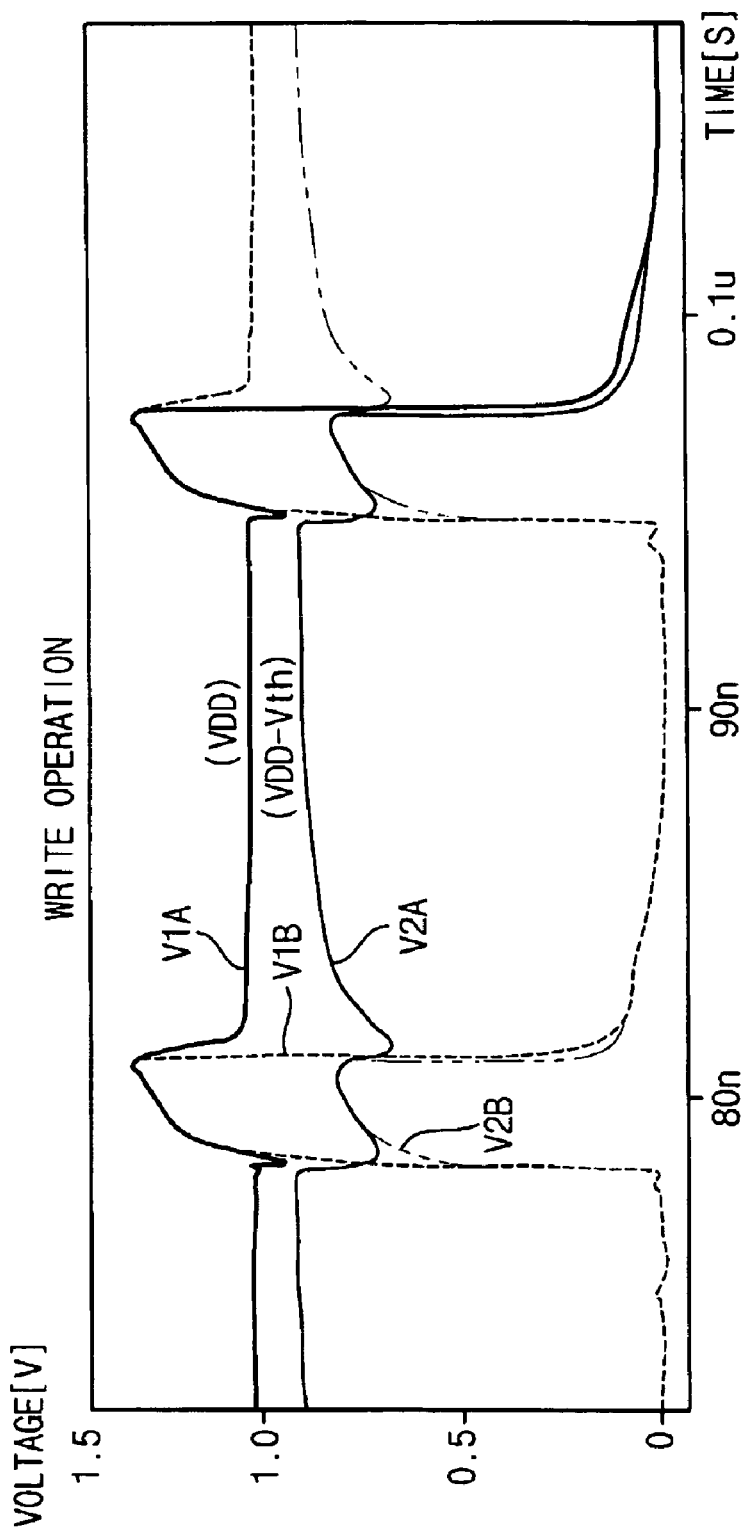
FIG. 10A is a graph showing simulation results of voltage waveforms of I/O lines GIO and GIOB in a precharge mode for a write operation, according to an example embodiment of the present invention compared to the conventional art.

FIG. 10A is a simulation graph illustrating voltage waveforms of I/O lines GIO and GIOB in a precharge mode for a write operation, according to an example embodiment of the present invention compared to the prior art.

In FIG. 10A, 'V1A' and 'V1B' represent the respective voltages V(GIO) and V(GIOB) of the I/O lines of the conventional semiconductor memory device. 'V2A' and 'V2B' represent the respective voltages V(GIO) and V(GIOB) of the I/O lines of the semiconductor memory device according to example embodiments of the present invention. The conventional semiconductor memory device includes the precharge circuit implemented using only PMOS transistors, and the semiconductor memory device according to example embodiments of the present invention includes the first precharge unit 210 including the PMOS transistors 211 and 212, and the second precharge unit 220 including the NMOS transistor 221 and 222 as shown, for example, in FIG. 4.

Referring to FIG. 10A, the I/O lines GIO and GIOB of the conventional semiconductor memory device are precharged to VDD in the precharge mode for the write operation. The I/O lines GIO and GIOB of the semiconductor memory device according to example embodiments of the present invention are precharged to (VDD-Vth) in the precharge mode for the write operation because the first precharge unit 210 including the PMOS transistors 211 and 212 may be turned off and the second precharge unit 420 including the NMOS transistors 221 and 222 may be turned on so that the I/O lines GIO and GIOB may be precharged to a lower voltage level (VDD-Vth) in the precharge mode for the write operation. As the I/O lines GIO and GIOB are precharged to the lower precharge level (VDD-Vth), the semiconductor memory device according to example embodiments of the present invention may have reduced power consumption and/or improved operating speed.

Figure 10B:
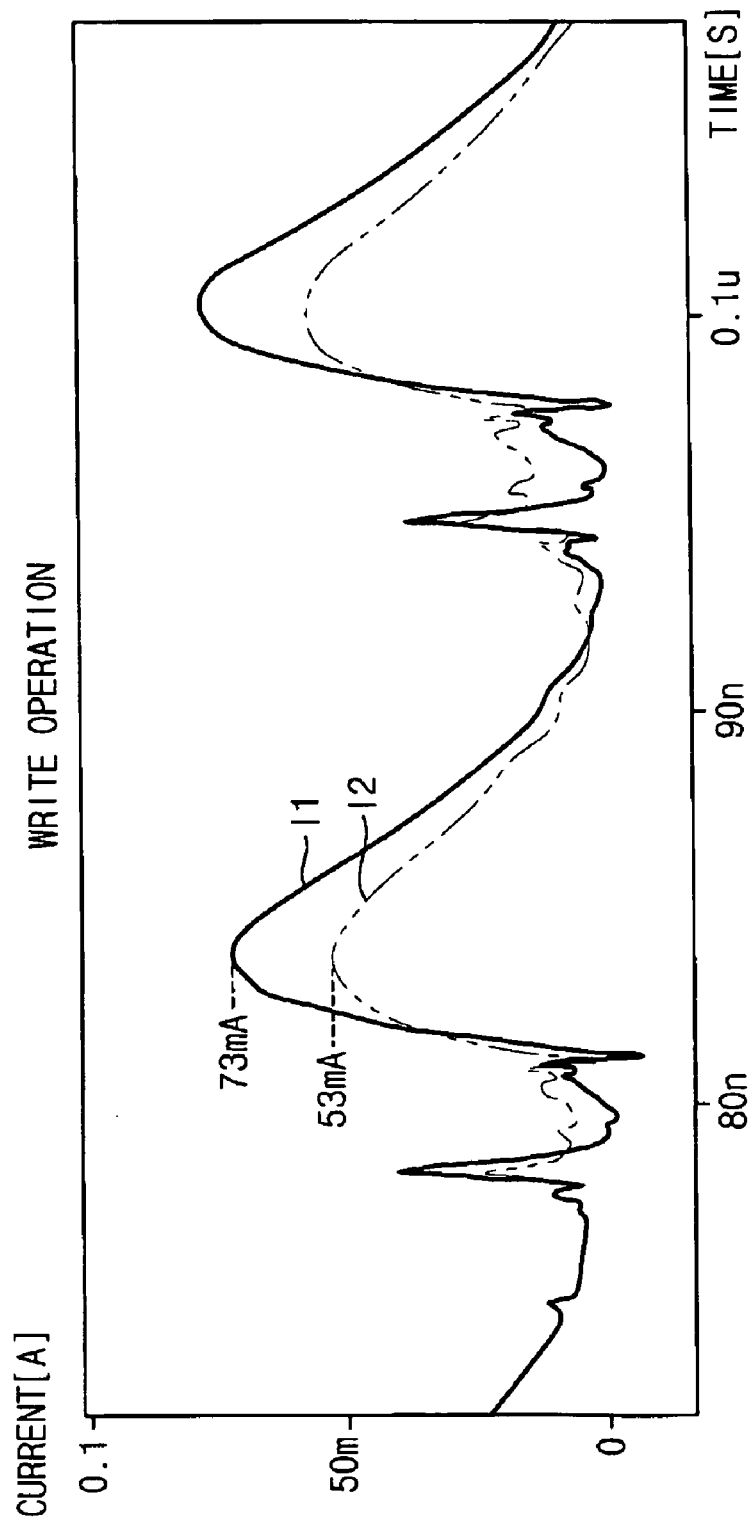
FIG. 10B is a graph showing simulation results of current waveforms of I/O lines GIO and GIOB in a precharge mode for a write operation, according to an example embodiment of the present invention compared to the conventional art.

FIG. 10B is a simulation graph illustrating current waveforms of I/O lines GIO and GIOB in a precharge mode for a write operation, according to an example embodiment of the present invention compared to the prior art. In FIG. 10B, 'I1' represents a current flowing from the I/O lines GIO and GIOB of the conventional semiconductor memory device to the ground. 'I2' represents a current flowing from the I/O lines GIO and GIOB of the semiconductor memory device according to example embodiments of the present invention to the ground. The conventional semiconductor memory device includes the precharge circuit composed of only PMOS transistors. The semiconductor memory device according to at least one example embodiment of the present invention includes the first precharge unit 210 shown, for example, in FIG. 4 composed of the PMOS transistors 211 and 212, and the second precharge unit 220 composed of the NMOS transistors 221 and 222.

Referring to FIG. 10B, in the precharge mode for the write operation, the current flowing from the I/O lines GIO and GIOB of the conventional semiconductor memory device to the ground records a maximum value of about 73 mA, whereas the current flowing from the I/O lines GIO and GIOB of the semiconductor memory device according to at least one example embodiment of the present invention to the ground records a maximum value of about 53 mA. In this example, in the precharge mode for the write operation the semiconductor memory device according to at least one example embodiment of the present invention has current flowing from the I/O lines GIO and GIOB to the ground that is less than that of the conventional semiconductor memory device. Thus, the I/O lines GIO and GIOB are precharged to (VDD-Vth) that is lower than that of the prior art because the first precharge unit 210 shown in FIG. 4 composed of the PMOS transistors 211 and 212 is turned off, and the second precharge unit 220 shown in FIG. 4 composed of the NMOS transistor 221 and 222 is turned on in the precharge mode for the write operation. Accordingly, the semiconductor memory device according to at least this example embodiment of the present invention may have reduced power consumption and/or improved operating speed.

As described above, the precharge circuit of the semiconductor memory device, according to example embodiments of the present invention, precharges the I/O lines to the voltage VDD in the precharge mode for the read operation, and precharges the I/O lines to a voltage level (VDD-Vth) in the precharge mode for the write operation. Therefore, the I/O lines may be precharged more stably.

The semiconductor memory device, according to at least some example embodiment of the present invention, may have reduced power consumption and/or improved operating speed because the I/O lines may be precharged to a voltage (VDD-Vth) lower than the voltage VDD in the precharge mode for the write operation.

In the semiconductor memory device, according to at least some example embodiments of the present invention, an I/O sense amplifier may more stably operate by precharging the I/O lines to the voltage VDD in the precharge mode for the read operation.

Although example embodiments of the present invention have been described with regard to specific NMOS and PMOS transistors, it will be understood that any suitable transistor may be used interchangeably.

While the example embodiments of the present invention and their advantages have been described in detail, it should be understood that various changes, substitutions and alterations may be made herein without departing from the scope of the invention.

What is claimed is:

1. A precharge circuit comprising:
    a precharge controller configured to enable a first control signal in a precharge mode for a read operation, and enable a second control signal in a precharge mode for a write operation;
    a first precharge unit configured to precharge a pair of I/O lines to a first voltage in response to the first control signal in the precharge mode for the read operation; and
    a second precharge unit configured to precharge the pair of I/O lines to a second voltage lower than the first voltage in response to the second control signal in the precharge mode for the write operation.

2. The precharge circuit of claim 1, wherein the first precharge unit is coupled between the pair of I/O lines and includes a plurality of transistors serially coupled to each other.

3. The precharge circuit of claim 2, wherein the plurality of transistors are PMOS transistors.

4. The precharge circuit of claim 1, wherein the second precharge unit is coupled between the pair of I/O lines and includes a plurality of transistors serially coupled to each other.

5. The precharge circuit of claim 4, wherein the plurality of transistors are NMOS transistors.

6. The precharge circuit of claim 2, wherein the first precharge unit includes,
    a first PMOS transistor configured to provide the first voltage to a first I/O line of the pair of I/O lines in response to the first control signal; and
    a second PMOS transistor configured to provide the first voltage to a second I/O line of the pair of I/O lines in response to the first control signal.

7. The precharge circuit of claim 2, wherein the second precharge unit includes,
    a first NMOS transistor configured to provide the second voltage to a first I/O line of the pair of I/O lines in response to the second control signal; and
    a second NMOS transistor configured to provide the second voltage to a second I/O line of the pair of I/O lines in response to the second control signal.

8. The precharge circuit of claim 1, wherein the first control signal is enabled when a write signal is disabled and a precharge signal is enabled, and the second control signal is enabled when the write signal and the precharge signal are enabled.

9. The precharge circuit of claim 1, wherein the precharge controller includes,
    a first inverter configured to invert a command signal;
    a second inverter configured to invert a write signal;
    a first NOR gate configured to perform a logical NOR operation on an output signal of the first inverter and an output signal of the second inverter;
    a second NOR gate configured to perform a logical NOR operation on the output signal of the first inverter and the write signal;
    a first NAND gate configured to perform a logical NAND operation on an output signal of the first NOR gate and the precharge signal;
    a third inverter configured to invert an output signal of the first NAND gate, to generate the second control signal; and
    a second NAND gate configured to perform a logical NAND operation on an output signal of the second NOR gate and the precharge signal, to generate the first control signal.

10. The precharge circuit of claim 9, wherein the precharge controller includes a fourth inverter configured to invert a precharge signal, to generate the third control signal.

11. The precharge circuit of claim 1, further comprising an equalizer configured to equalize the pair of I/O lines in response to a third control signal.

12. The precharge circuit of claim 11, wherein the equalizer includes a transistor for equalizing the pair of I/O lines in response to the third control signal.

13. The precharge circuit of claim 12, wherein the transistor included in the equalizer is a PMOS transistor.

14. The precharge circuit of claim 1, wherein the first control signal is generated when a write signal is disabled and a precharge signal is enabled, and the second control signal is generated when the precharge signal is enabled.

15. The precharge circuit of claim 1, wherein the precharge controller includes,
   a first inverter configured to invert a command signal;
   a first NOR gate configured to perform a logical NOR operation on a write signal and an output signal of the first inverter;
   a first NAND gate configured to perform a logical NAND operation on the precharge signal and an output signal of the first NOR gate;
   a second inverter configured to invert the precharge signal, to generate the third control signal;
   a third inverter configured to invert an output signal of the second inverter, to generate the second control signal;
   a fourth inverter configured to invert an output signal of the first NAND gate; and
   a second NAND gate configured to perform a logical NAND operation on an output signal of the fourth inverter and the second control signal, to generate the first control signal.

16. A semiconductor memory device comprising:
   a plurality of pairs of I/O lines;
   an I/O line driver configured to drive the pair of I/O lines in response to a write command signal and input data;
   a precharge controller configured to enable a first control signal in a precharge mode for a read operation, and enable a second control signal in a precharge mode for a write operation;
   a first precharge unit configured to precharge the pair of I/O lines to a first voltage in response to the first control signal in the precharge mode for the read operation; and
   a second precharge unit configured to precharge the pair of I/O lines to a second voltage lower than the first voltage in response to the second control signal in the precharge mode for the write operation.

17. The semiconductor memory device of claim 16, further including an equalizer configured to equalize the pair of I/O lines.

18. The semiconductor memory device of claim 16, wherein the first control signal is enabled when a write signal is disabled and a precharge signal is enabled, and the second control signal is enabled when the write signal and the precharge signal are enabled.

19. The semiconductor memory device of claim 16, wherein the first control signal is enabled when a write signal is disabled and a precharge signal is enabled, and the second control signal is enabled when the precharge signal is enabled.

20. A method of precharging an input and output (I/O) line of a semiconductor memory device, the method comprising:
   generating a first control signal and a second control signal in response to a write signal and a precharge signal;
   precharging a pair of I/O lines to a first voltage in response to the first control signal, in a precharge mode for a read operation; and
   precharging the pair of I/O lines to a second voltage lower than the first voltage in response to the second control signal, in a precharge mode for a write operation.

* * * * *